United States Patent [19]
Lee

[11] Patent Number: 5,773,337
[45] Date of Patent: Jun. 30, 1998

[54] METHOD FOR FORMING ULTRA-SHALLOW JUNCTION OF SEMICONDUCTOR DEVICE

[75] Inventor: Kil Ho Lee, Kyoungki-do, Rep. of Korea

[73] Assignee: Hyundai Electronics Industries Co., Ltd., Ichon-shi, Rep. of Korea

[21] Appl. No.: 929,061

[22] Filed: Sep. 15, 1997

[30] Foreign Application Priority Data

Dec. 31, 1996 [KR] Rep. of Korea ............... 96-80233

[51] Int. Cl.⁶ .................................... H01L 21/8238
[52] U.S. Cl. ................. 438/199; 438/297; 438/301; 438/308; 438/369; 438/378; 438/530; 438/540; 438/550; 257/344
[58] Field of Search .................. 438/199, 297, 438/301, 308, 369, 378, 530, 540, 550; 257/344

[56] References Cited

U.S. PATENT DOCUMENTS

| | | |
|---|---|---|
| 4,042,419 | 8/1977 | Heinke et al. .................. 148/187 |
| 5,399,506 | 3/1995 | Tsukamoto ...................... 437/19 |
| 5,411,906 | 5/1995 | Johnson et al. ................ 437/44 |
| 5,552,332 | 9/1996 | Tseng et al. ..................... 437/41 |
| 5,605,854 | 2/1997 | Yoo . | |
| 5,668,024 | 9/1997 | Tsai et al. ....................... 438/199 |

*Primary Examiner*—John Niebling
*Assistant Examiner*—Long Pham

[57] ABSTRACT

There is disclosed a method for forming an ultra-shallow junction of a semiconductor device, comprising a four-stage RTA process following the ion implantation of dopants for source/drain junction, the RTA process being carried out with high temperature-elevating and -quenching rates between the stages, in such a way that relatively low temperatures are used for a short time in the first three stages in order to eliminate only the point defects, which greatly affect the diffusion of dopants, without diffusion of dopants while a relatively high temperature is taken in the last stage with the aim of allowing the dopants to diffuse a little to $p^+$ and $n^+$ shallow junctions, thereby obtaining an improvement in electrical activity and reducing junction current leakage and thus, improving the properties and reliability of the resulting semiconductor device.

15 Claims, 2 Drawing Sheets

METHOD FOR FORMING ULTRA-SHALLOW JUNCTION OF SEMICONDUCTOR DEVICE

BACKGROUND OF THE INVENTION

1. Field of the Invention

The present invention relates, in general, to a method for forming an ultra-shallow junction of a semiconductor device and, more particularly, to a four-stage rapid thermal annealing process by which there can be obtained an improvement in electrical activity and junction current leakage and thus, in the properties and reliability of the resulting semiconductor device.

2. Description of the Prior Art

In order to better understand the background of the invention, a description will be given of a conventional method for forming $n^+$ and $p^+$ source/drain regions of a semiconductor device, in conjunction with FIG. 1.

Firstly, there is prepared a semiconductor substrate 11 over which a p-well 13 and an n-well 14, an element-isolating film 12, a gate oxide 15, a gate electrode and an n-LDD (lightly doped drain) region 17, and a spacer oxide 18 are, in sequence, formed.

Thereafter, arsenic is implanted at 20–40 KeV at a dose of $2E15$–$6E15/cm^2$, to form an n-type source/drain junction region 19.

Then, boron fluoride ($BF_2$) is implanted at 10–40 KeV at a dose of $2E15$–$5E15/cm^2$, to create a $p^+$ type source/drain junction region 20.

Subsequently, a first interlayer insulating film 21, such as low pressure tetra-ethyl-ortho-silicate (hereinafter referred to as "TEOS") oxide, and a second interlayer insulating film 22, such as boro-phospho-silicate-glass (hereinafter referred to as "BPSG"), are sequentially deposited over the resulting structure.

It is, however, very difficult to form an ultra-shallow junction superior in electrical properties by such a conventional method. In detail, when boron fluoride is ion-implanted to form the $p^+$ type source/drain junction region 20, the fluorine makes the surface of the semiconductor substrate 11 amorphous, causing point defects to widely occur below the initial amorphous/crystalline boundary. Upon a subsequent thermal treatment, the point defects not only accelerate the diffusion of the boron but also induce secondary defects or extended defects, leading to inhibiting the electrical activity of the boron and increasing junction current leakage.

In order to obtain a junction without the defect attributable to the ion implantation, a thermal treatment step is carried out at 950°–1,050° C. for 5–10 sec. Arsenic and boron fluoride, however, are different from each other in ion implantation condition, so there are differences in the conditions between the short period thermal treatment step for the removal of defects from the $n^+$ source/drain junction region 19 and that for the removal of defects from the $p^+$ source/drain junction region 20. Owing to this, the defects are difficult to remove from the two junctions. Further, the desired depths of $n^+$ and $p^+$ junctions cannot be accomplished at the same time by carrying out the one-stage thermal treatment step.

SUMMARY OF THE INVENTION

Therefore, it is an object of the present invention to overcome the above problems encountered in prior arts and to provide a method for forming an ultra-shallow junction of a semiconductor device, whereby electrical activity and junction current leakage can be improved and thus, also are improved the properties and reliability of the resulting semiconductor device.

In accordance with the present invention, there is provided a method for forming an ultra-shallow junction of a semiconductor device, comprising the steps of: forming a p well, an n well, an element-isolating film and a gate electrode over a semiconductor substrate; ion-implanting dopants for $p^+$ and $n^+$ source/drain junction regions into the semiconductor substrate; carrying out a first stage of a rapid thermal annealing process to recombine interstitials and vacancies without diffusion of the dopants, so as to eliminate point defects; repeating the first stage as a second stage of the rapid thermal annealing process; carrying out a third stage of the rapid thermal annealing process at a lower temperature than that of the first and the second stages to confirm the recombination of interstitials and vacancies without diffusion of the dopants, so as to eliminate point defects; carrying out a fourth stage of the rapid thermal annealing process at a higher temperature than those of the first to the third stages to diffuse the dopants to form the ultra-shallow junction region; and forming a first interlayer insulating film and a second interlayer insulating film.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

Figure 1:
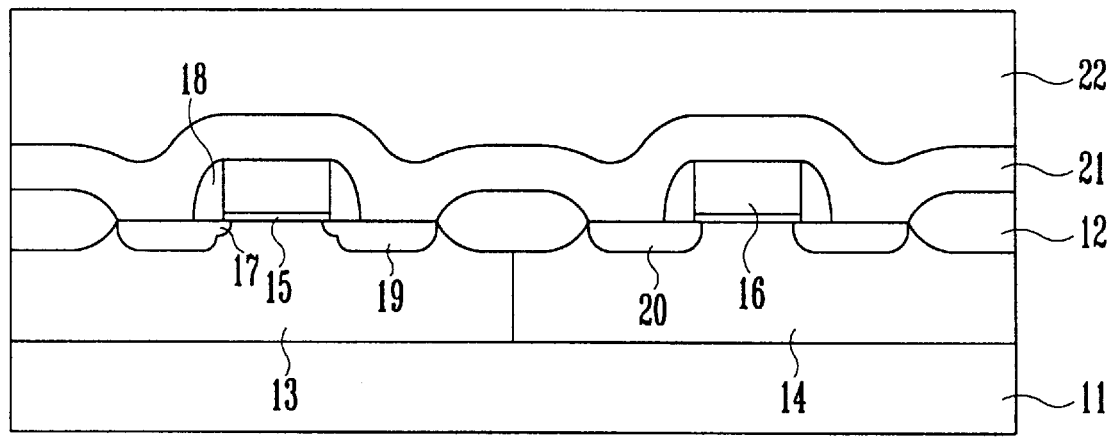
FIG. 1 is a schematic cross sectional view showing a conventional method for forming an ultra-shallow junction of a semiconductor device.
Figure 2A:
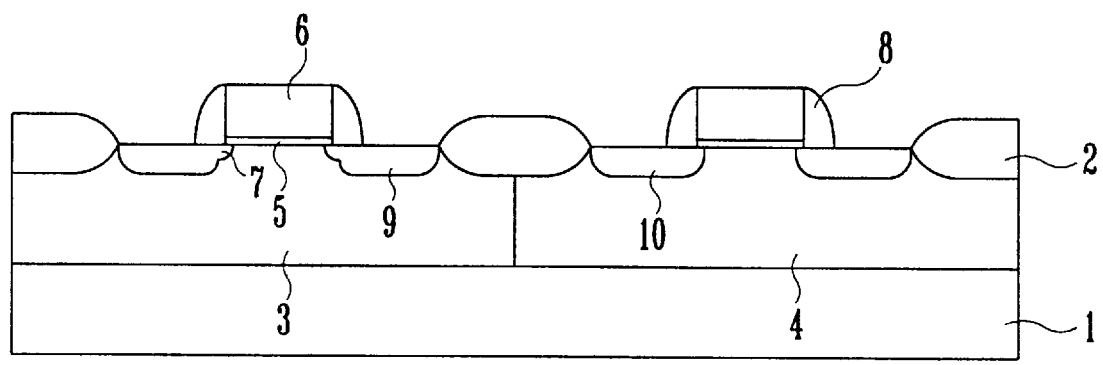
FIGS. 2A to 2C are schematic cross sectional views showing a method for forming an ultra-shallow junction of a semiconductor device, in accordance with the invention.
Figure 2B:
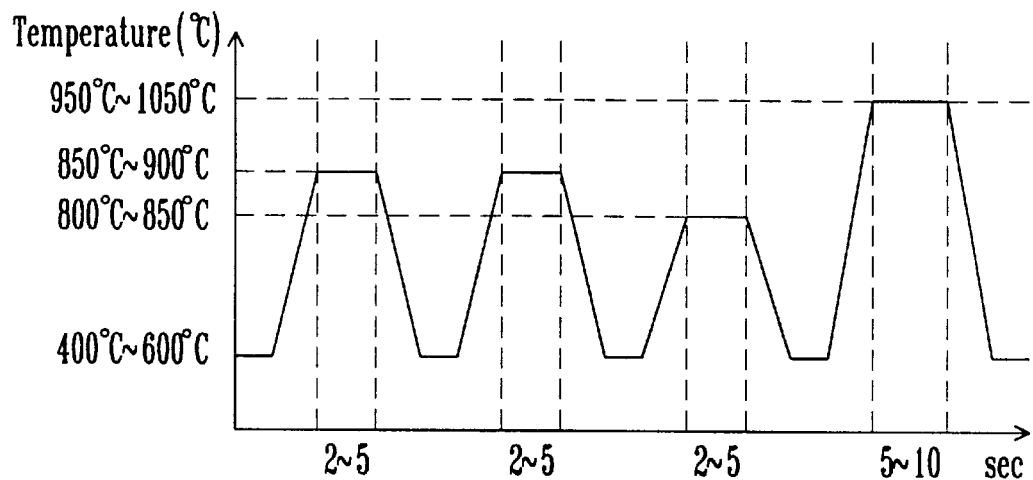
Figure 2C:
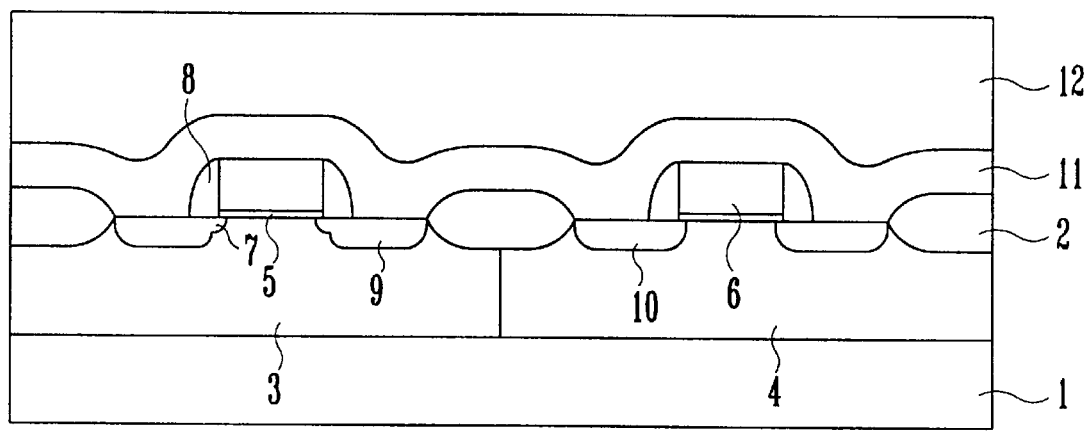

Referring to FIGS. 2A to 2C, a method for forming an ultra-shallow junction of a semiconductor device is illustrated according to the present invention.

As shown in FIG. 2A, there is a prepared a semiconductor substrate 1 in which an n well 4 and a p well 3 are formed, followed by sequentially forming an element-isolating film 2, a gate oxide 5 and a gate electrode 6 over each of the wells.

After a photoresist film for n-LDD is coated over the n well region, As or P dopants are implanted into the p well region at an energy of 10–30 KeV at a dose of $1E13$–$5E13/cm^2$, to create an n-LDD region 7.

Then, the n-LDD photoresist film is removed and a spacer oxide 8 is formed at the side wall of the gate electrode 6. Under the condition that a photoresist film for $p^+$ source/drain is coated over the p well region, an ion implantation process is carried out at a dose of $2E15$–$5E15/cm^2$ and at an ion acceleration energy of 10–40 KeV for boron fluoride dopants or at an energy of 2–10 KeV for boron dopants, to make a $p^+$ source/drain junction region 10, a high density boron-doped region.

Thereafter, arsenic (As) dopants are implanted at an energy of 20–40 KeV at a dose of $2E15$–$6E15/cm^2$, to make an $n^+$ source/drain junction region 9, a high density arsenic-doped region.

In order to prevent the metal impurities, which might be implanted together with dopants during the ion implantation, from penetrating into the substrate, the above ion implantation processes are carried out through a thermal oxide which has grown to a thickness of 50–100 Angstrom in a dry manner.

FIG. 2B shows a four-stage RTA process according to the present invention. In the first stage, the heat temperature of the semiconductor substrate is increased from 400°–600° C. up to 850°–950° C. at which it is maintained for 2–5 sec, then, returned again to 400°–600° C. This procedure is repeated for the second step. This thermal treatment at such a relatively low temperature aims to diffuse the point defects, such as interstitials and vacancies, to recombine them together without diffusion of the boron or arsenic. However, there is a possibility of affecting the diffusion of the dopants even at the low temperature if the thermal treatment is maintained for a long time. Thus, the thermal treatment is performed as shortly as possible and preferably for 2–5 sec.

In the first stage, temperature is raised at a rate of 50°–100° C./sec. Such a high temperature elevation rate aims to exclude the possibility that the diffusion of dopant might be deleteriously affected by low elevation rates and to maximize the recombination of the point defects.

In the first two stages of the low temperature RTA, a significant number of point defects are reduced.

Then, in the third stage, the RTA is carried out at a lower temperature than those of the first and the second stages, that is, at 800°–850° C. for 2–5 sec. Here, the lower temperature has an effect of removing the point defect which may remain even after the first and the second RTAs.

As for the fourth stage of RTA, it is carried out at 950°–1,050° C., the highest of the four stages, for 5–10 sec. At the low temperatures of the former first to third stages of RTA is neither the diffusion of the dopants nor electrical activation done, so that there is accomplished no function of junction. Therefore, this high temperature in the last stage allows the formation of junction.

Herein, an ultra-shallow junction can be obtained by virtue of the fact that no significant diffusion of the dopants, arsenic or boron, occurs even at a high temperature in the fourth stage of RTA: vacancies and silicon interstitial, which have a significant influence on the diffusion of arsenic and boron, are remarkably eliminated owing to their recombination in the first to the third stages of RTA.

After completion of the four stages of RTA, a TEOS film and a BPSG film are formed as a first interlayer insulating film 11 and a second insulating film 12, respectively, as shown in FIG. 2C. The TEOS insulating film 11 is formed in a low pressure manner and may be substituted with a medium temperature CVD oxide 300–800 Angstrom in thickness while the second insulating film 12 is made by depositing germanium-doped BPSG (Ge-BPSG) at a thickness of 2,500–4,000 Angstrom at 750°–780° C. This temperature does not affect the junction created by the four-stage RTA. Planarization is accomplished with the integrity BPSG film. Instead of the BPSG film 12, a blanket of another type insulating film may be deposited and then, subjected to chemical mechanical polishing until it has a thickness of 2,500–4,000 Angstrom.

From the first stage to the fourth stage, the RTA is fulfilled at temperature-elevating and -quenching rates ranging from 50° to 100° C./sec, so as to exclude any possibility of affecting the diffusion of dopant and to maximize the recombination of point defects.

According to the method for forming an ultra-shallow junction of a semiconductor device, as described hereinbefore, a four-stage RTA process, following the ion implantation of dopants for source/drain junction, is carried out with high temperature-elevating and -quenching rate between the stages, in such a way that relatively low temperatures are used for a short time in the first three stages in order to eliminate only the point defects, which greatly affect the diffusion of dopants, without diffusion of dopants while a relatively high temperature is used in the last stage with the aim of allowing the dopants to diffuse a little to $p^+$ and $n^+$ shallow junctions, thereby obtaining an improvement in electrical activity and reducing junction current leakage and thus, improving the properties and reliability of the resulting semiconductor device.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for forming an ultra-shallow junction of a semiconductor device, comprising the steps of:

forming a p well, an n well, an element-isolating film and a gate electrode over the semiconductor substrate;

ion-implanting dopants for forming $p^+$ and $n^+$ source/drain junction regions into the semiconductor substrate;

carrying out a first stage of a rapid thermal annealing process to recombine interstitials and vacancies without diffusion of the dopants, so as to eliminate point defects;

repeating the first stage as a second stage of the rapid thermal annealing process;

carrying out a third stage of the rapid thermal annealing process at a lower temperature than that of the first and the second stages to confirm the recombination of interstitials and vacancies without diffusion of the dopants, so as to eliminate point defects;

carrying out a fourth stage of the rapid thermal annealing process at a higher temperature than those of the first to the third stages to diffuse the dopants to form the ultra-shallow junction region; and forming a first interlayer insulating film and a second interlayer insulating film.

2. A method in accordance with claim 1, wherein said first and said second stages of the rapid thermal annealing process are each carried out at 850°–900° C. for 2–5 sec.

3. A method in accordance with claim 1, wherein said third stage of the rapid thermal annealing process is carried out at 800°–850° C. for 2–5 sec.

4. A method in accordance with claim 1, wherein said fourth stage of the rapid thermal annealing process is carried out at 950°–1,050° C. for 5–10 sec.

5. A method in accordance with claim 3, wherein said fourth stage of the rapid thermal annealing process is carried out at 950°–1,050° C. for 5–10 sec.

6. A method in accordance with claim 1, wherein a desired temperature of the rapid thermal annealing process is increased from 400°–600° C. in said first stage.

7. A method in accordance with claim 5, wherein a desired temperature of the rapid thermal annealing process is increased from 400°–600° C. in said fourth stage.

8. A method in accordance with claim 1, wherein a interstage temperature-elevating and -quenching rate in the first through the fourth stages range from 50° to 100° C.

9. A method in accordance with claim 7, wherein a interstage temperature-elevating and -quenching rate in the first through the fourth stages range from 50° to 100° C.

10. A method in accordance with claim 1, wherein said first interlayer insulating film is formed of a low pressure tetra-ethyl-ortho-silicate oxide ranging, in thickness, from 300 to 800 Angstrom.

11. A method in accordance with claim 1, wherein said second interlayer insulating film is formed of germanium-doped boro-phospho-silicate-glass ranging, in thickness, from 2,500 to 4,000 Angstrom.

12. A method in accordance with claim 1, wherein said second interlayer insulating film is formed of integrity phospho-silicate-glass ranging, in thickness, from 2,500 to 4,000 Angstrom.

13. A method in accordance with claim 1, wherein said $p^+$ source/drain junction region is formed by implanting boron fluoride dopants at an energy of 10–40 KeV and at a dose of $2E15-5E15/cm^2$.

14. A method in accordance with claim 1, wherein said $p^+$ source/drain junction region is formed by implanting boron dopants at an energy of 2–10 KeV and at a dose of $2E15-5E15/cm^2$.

15. A method in accordance with claim 1, wherein said $n^+$ source/drain junction region is formed by implanting arsenic dopants at an energy of 20–40 KeV and at a dose of $2E15-6E15/cm^2$.

* * * * *